United States Patent
Hosoya

(10) Patent No.: US 7,173,502 B2
(45) Date of Patent: Feb. 6, 2007

(54) REFLECTION LOSS SUPPRESSION CIRCUIT

(75) Inventor: Kenichi Hosoya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/447,838

(22) Filed: Jun. 7, 2006

(65) Prior Publication Data

US 2006/0238269 A1    Oct. 26, 2006

Related U.S. Application Data

(62) Division of application No. 10/474,063, filed on Jul. 8, 2004.

(51) Int. Cl.
*H03H 7/38* (2006.01)

(52) U.S. Cl. .................... 333/33; 333/35; 333/22 R

(58) Field of Classification Search .............. 333/33, 333/35, 22 R
See application file for complete search history.

(56) References Cited

U.S. PATENT DOCUMENTS 5,736,901 A    4/1998  Nakamura et al.
5,920,230 A    7/1999  Beall
6,259,332 B1   7/2001  Hosoya

FOREIGN PATENT DOCUMENTS

| JP | 60-1021      | 1/1985 |
| JP | 62-147903    | 9/1987 |
| JP | 03 218101 A  | 9/1991 |
| JP | 5-75361      | 3/1993 |
| JP | 5-136639     | 6/1993 |
| JP | 6-164267     | 6/1994 |
| JP | 07 038 349 A | 2/1995 |
| JP | 09 069 731 A | 3/1997 |
| JP | 11-195939    | 7/1999 |
| JP | 2000-114870  | 4/2000 |

*Primary Examiner*—Stephen E. Jones
(74) *Attorney, Agent, or Firm*—McGinn IP Law Group, PLLC

(57) ABSTRACT

An object is to suppress a reflection loss in any desired frequency band outside a required band, without affecting circuit characteristics in the required frequency band. The output impedance of a circuit in a specified frequency band is transformed into a high impedance by a transmission line 15. A resistance grounding circuit 18 having a frequency selectivity is connected in parallel. The resistance grounding circuit 18 is constructed of a resistor 16 which has a resistance close to a load resistance, a capacitance C which is selected so as to satisfy an equation $\text{Im}[\tanh\{\gamma(\lambda/2-\delta)\}]=-\omega_0 C Z_0$ at an angular frequency $\omega_0$ included in the frequency band, and a $(\lambda/2-\delta)$-long end-open stub.

5 Claims, 12 Drawing Sheets freq=78~82GHz,1GHz step

REFLECTION LOSS SUPPRESSION CIRCUIT

The present Application is a Divisional Application of U.S. patent application Ser. No. 10/474,063, filed on Oct. 6, 2003.

TECHNICAL FIELD

The present invention relates to a reflection loss suppression circuit for use in various microwave/milliwave circuits and digital circuits.

BACKGROUND ART

Heretofore, microwave/milliwave circuits which perform the amplification, oscillation, mixing, etc. of radio frequency signals, and digital circuits which perform the amplification, identification, branch, etc. of digital signals have been put into practical use in various systems.

Among the various circuits, a wideband amplifier of distributed type for use in an optical communication system or a radio communication system will be described with reference to FIG. 1. FIG. 1 is a circuit diagram showing an example of the distributed amplifier in the prior art.

The distributed amplifier in the prior art is a cascode-type distributed amplifier of three-stage configuration as employs HBT cascode pairs 3 each being constructed by cascode-connecting a hetero-junction bipolar transistor (hereinbelow, abbreviated to "HBT") 1 and an HBT 2. An input signal is received from an input terminal 7, while an output signal is delivered from an output terminal 8. The base terminal of the HBT 1 is fed with a DC supply voltage from a base power source 9 through a terminating resistor 12. The collector terminal of the HBT 2 is fed with a DC supply voltage from a collector power source 10 through a terminating resistor 12. The base terminal of the HBT 2 is fed with a DC supply voltage from a cascode power source 11 through a terminating resistor 12. Besides, the base terminal of the HBT 2 is grounded radio-frequency-wise through an RF grounding capacitor 13.

The distributed amplifier stated above forms a transmission line of high cutoff frequency by combining the parasitic reactances of the HBTs 1 and HBTs 2 with high-impedance transmission lines 4 and 5. The transmission line has a characteristic impedance which is equal to each of a signal source impedance and a load impedance, and it can realize a flat gain and a low reflection loss over a wide band.

With the cascode-type distributed amplifier in the prior art as shown in FIG. 1, however, a reflection loss particularly on an output side increases outside a required frequency band. There has accordingly been the problem that the reflection loss leads to the occurrence of a negative resistance in some cases. There has also been the problem that the stability of the circuit is consequently degraded to give rise to a parasitic oscillation or an unstable operation.

Incidentally, although the distributed amplifier has been exemplified here, the problems explained above are problems which can occur in various circuits such as microwave/milliwave circuits which perform the amplification, oscillation, mixing, etc. of radio frequency signals, and digital circuits which perform the amplification, identification, branch, etc. of digital signals.

The present invention has been made in view of the above problems. An object of the present invention is to connect a reflection loss suppression circuit to any of various circuits including a distributed amplifier, whereby a reflection loss outside a required frequency band is satisfactorily suppressed without degrading the characteristics of the circuit in the required frequency band, so as to attain the stability of the circuit.

DISCLOSURE OF THE INVENTION

In order to accomplish the above object, in a radio frequency circuit or a digital circuit, a reflection loss suppression circuit of the present invention comprises a transmission line which transforms an output impedance or an input impedance in a specified frequency band into a high impedance; and a resistance grounding circuit having a frequency selectivity, which is connected in parallel with the transmission line as viewed from an output terminal side or an input terminal side. The resistance grounding circuit includes a resistor having a predetermined resistance in the vicinity of a load resistance or a signal source resistance, and has a low impedance in the specified frequency band. The resistance grounding circuit is constructed of a circuit which is terminated by a one-terminal pair circuit having a high impedance outside the frequency band.

The one-terminal pair circuit is constructed of an end-open stub which has a length equal to a quarter wavelength of a fundamental wave at any desired frequency included in the specified frequency band.

The one-terminal pair circuit is constructed of a circuit in which a capacitance element is terminated by an end-open stub shorter by $\delta$ than a half wavelength of a fundamental wave, when $\delta$ is let denote a length being sufficiently small as compared with a wavelength $\lambda$ of the fundamental wave at any desired frequency included in the frequency band. At an angular frequency $\omega_0$ corresponding to the frequency, a capacitance C of the capacitance element, a characteristic impedance $Z_0$ and a propagation constant $\gamma$ of the end-open stub, and the length $\delta$ are selected so as to satisfy:

$$Im[\tan h\{\gamma(\lambda/2-\delta)\}]=-\omega_0 \times C \times Z_0.$$

The one-terminal pair circuit is constructed of a circuit in which an inductor element is terminated by an end-open stub longer by $\delta$ than a half wavelength of a fundamental wave, when $\delta$ is let denote a length being sufficiently small as compared with a wavelength $\lambda$ of the fundamental wave at any desired frequency included in the frequency band. At an angular frequency $\omega_0$ corresponding to the frequency, an inductance L of the inductor element, a characteristic impedance $Z_0$ and a propagation constant $\gamma$ of the end-open stub, and the length $\delta$ are selected so as to satisfy:

$$Im[\tan h\{\gamma(\lambda/2-\delta)\}]=Z_0/(\omega_0 \times L).$$

The transmission line and the end-open stub are formed by employing microstrip lines or coplanar lines.

In a radio frequency circuit or a digital circuit, a reflection loss suppression circuit in the present invention comprises a transmission line which transforms an output impedance or an input impedance in a specified frequency band into a high impedance, and a resistance grounding circuit having a frequency selectivity, which is connected in parallel with the transmission line as viewed from an output terminal side or an input terminal side. The resistance grounding circuit is constructed of a circuit in which a band-pass filter for passing a signal of the frequency band is grounded through a resistor having a predetermined resistance in the vicinity of a load resistance or a signal source resistance.

The band-pass filter is constructed of an interdigital capacitor which has a length equal to a quarter wavelength of a fundamental wave at any desired frequency included in the specified frequency band.

An electric length of the transmission line is set in a range of ±50% of an absolute value of an output impedance with the transmission line viewed. A resistance of the resistor constituting the resistance grounding circuit should preferably be set in a range of 0.5 through 2 times the load resistance or the signal source resistance.

A wideband amplifier according to the present invention comprises the reflection loss suppression circuit at, at least, one of an output end and an input end.

BEST MODE FOR CARRYING OUT THE INVENTION

Figure 1:
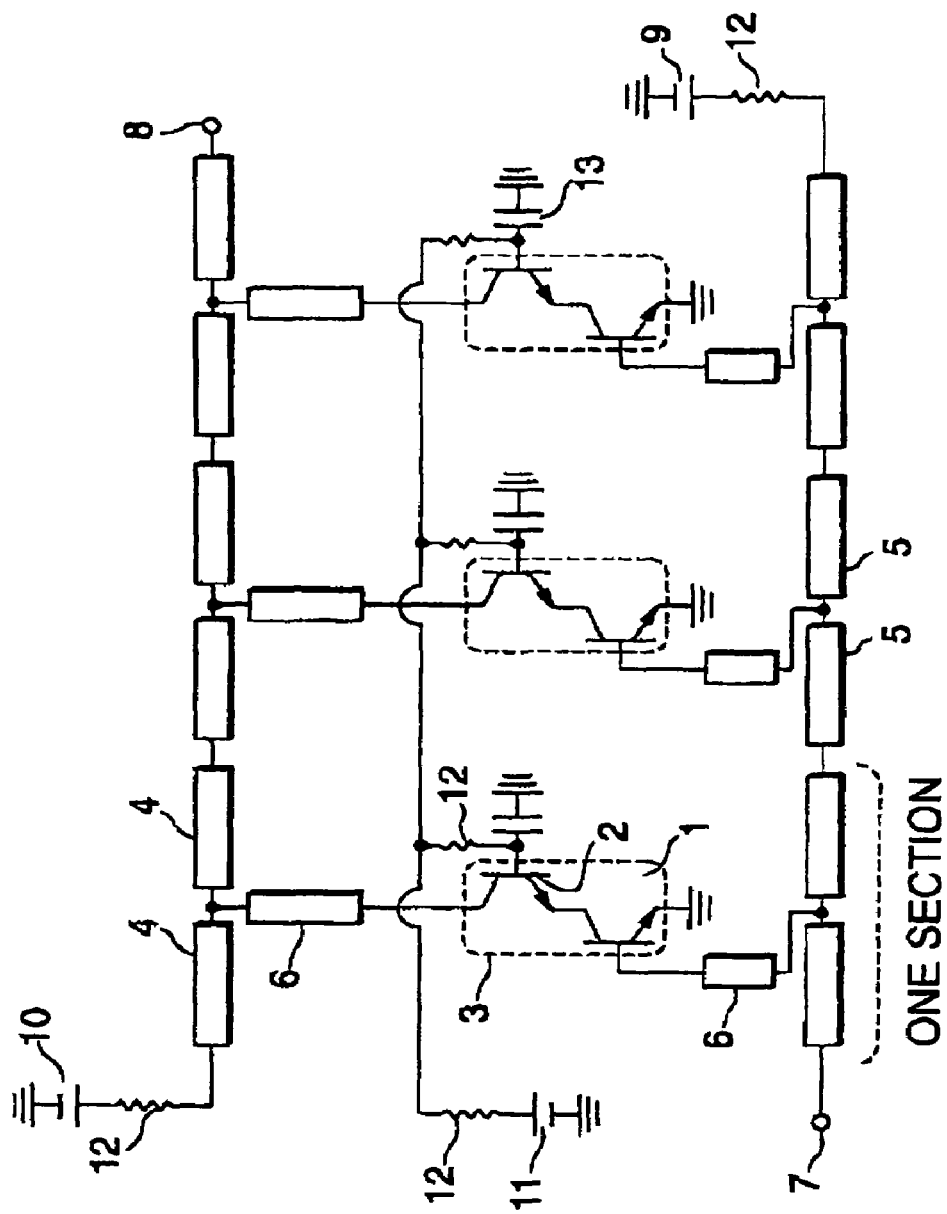
FIG. 1 is a circuit diagram for explaining a distributed amplifier in the prior art.
Figure 2:
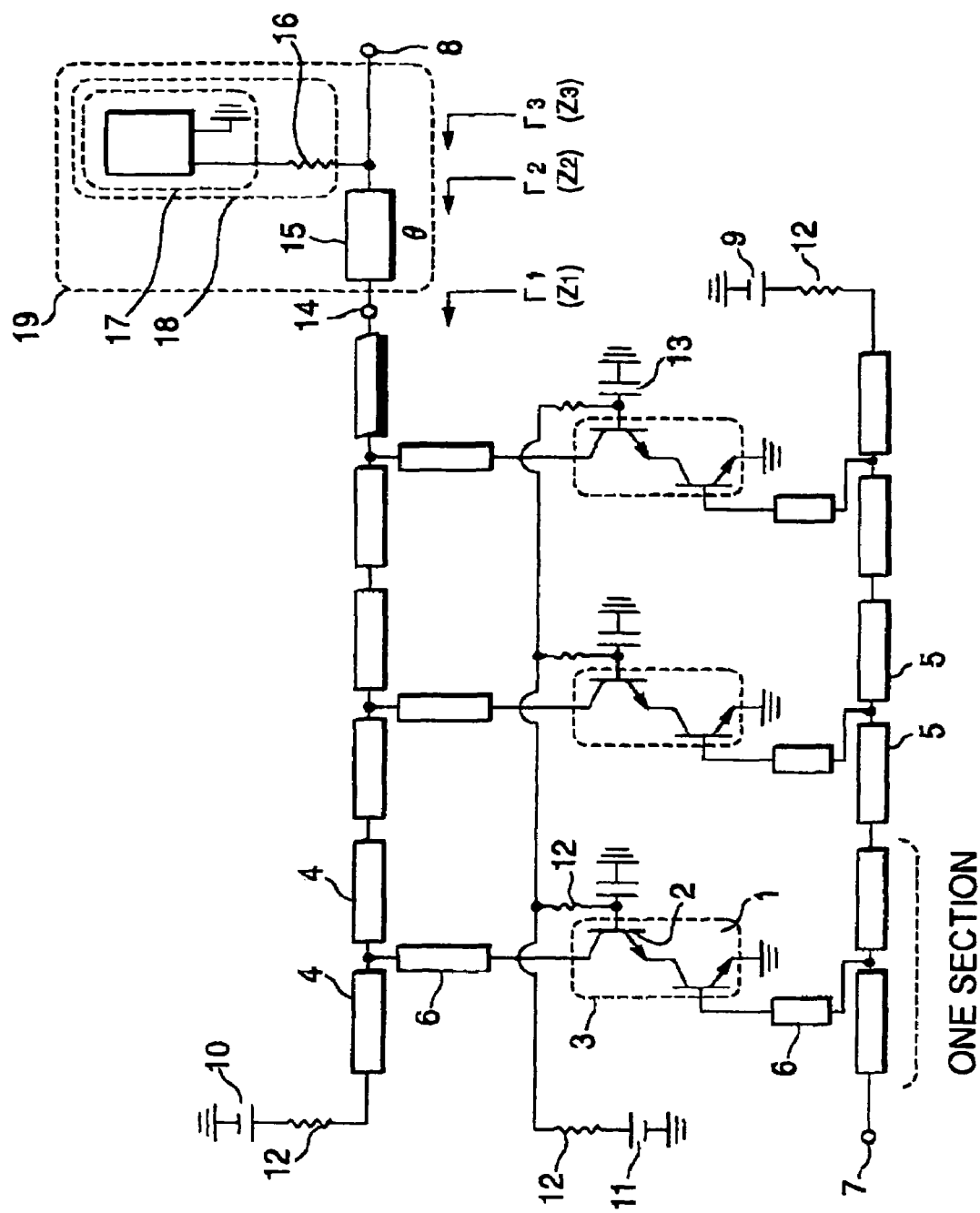
FIG. 2 is a circuit diagram for explaining the arrangement of a reflection loss suppression circuit according to the first embodiment of the present invention.

Now, a reflection loss suppression circuit according to the first embodiment of the present invention will be described with reference to FIG. 2. FIG. 2 is a circuit diagram showing an example in which the reflection loss suppression circuit in this embodiment is connected to the output end of a distributed amplifier. By the way, in this embodiment, a portion except the reflection loss suppression circuit 19 has the same arrangement as that of the prior-art distributed amplifier shown in FIG. 1, and the same reference numerals are assigned to the same parts.

The reflection loss suppression circuit 19 in this embodiment is constructed of a transmission line 15 which is connected in series with the output end 14 of the distributed amplifier, and a resistance grounding circuit 18 which has a frequency selectivity and which is connected in parallel with the transmission line 15 as viewed from the side of the output terminal 8. The electric length θ of the transmission line 15 is selected within a range of ±50% before and behind a value which maximizes the absolute value of an output impedance Z2 with the transmission line 15 viewed. The resistance grounding circuit 18 is constructed of a resistor 16, and a one-terminal pair circuit 17 which exhibits a low impedance in a frequency band to have a reflection loss suppressed therein and which exhibits a high impedance in any other frequency band. The resistance of the resistor 16 is selected within a range of 0.5 through 2 times a load resistance or a signal source resistance.

According to the above construction, an output impedance Z1 in the frequency band to have the reflection loss suppressed therein is transformed into the high impedance Z2 by the transmission line 15, and the resistance grounding circuit 18 is thereafter connected in parallel. Therefore, the output impedance Z3 of the whole circuit becomes substantially equal to the value of the resistor 16. Accordingly, the reflection loss can be suppressed by setting the resistance of the resistor 16 in the vicinity of the load resistance, concretely, within the range of 0.5 through 2 times the load resistance. Moreover, the above effect can be realized without affecting circuit characteristics outside the frequency band to have the reflection loss suppressed therein, by sufficiently heightening the frequency selectivity of the resistance grounding circuit 18, namely, the one-terminal pair circuit 17.

Figure 3:
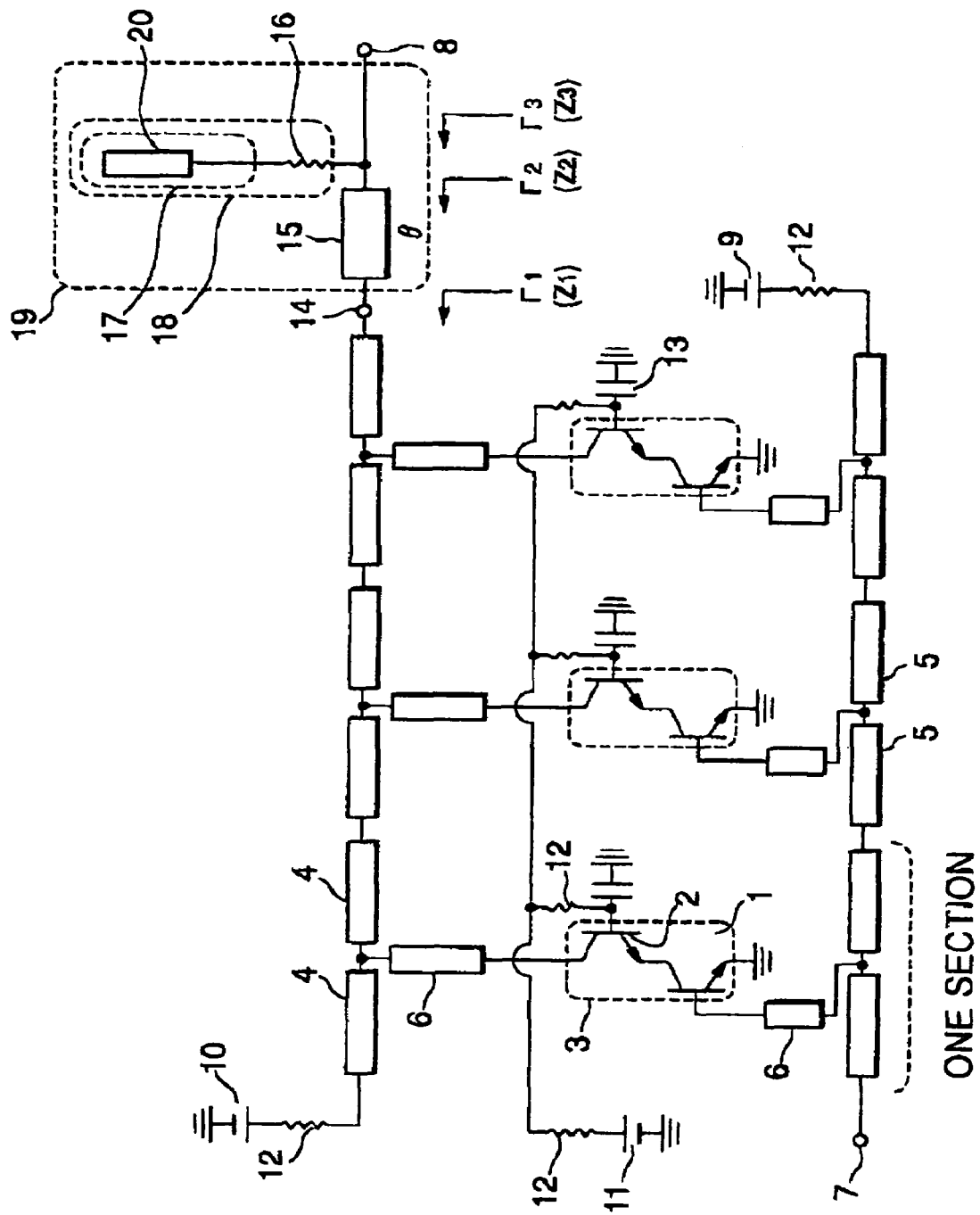
FIG. 3 is a circuit diagram for explaining the arrangement of a reflection loss suppression circuit according to the second embodiment of the present invention.

Next, a reflection loss suppression circuit according to the second embodiment of the present invention will be described with reference to FIG. 3. FIG. 3 is a circuit diagram showing an example in which the reflection loss suppression circuit in this embodiment is connected to the output end of a distributed amplifier. Incidentally, the same reference numerals and signs are assigned to the same parts as in the reflection loss suppression circuit shown in FIG. 2.

The reflection loss suppression circuit in this embodiment exhibits a low impedance in a frequency band to have a reflection loss suppressed therein. A one-terminal pair circuit 17 which exhibits a high impedance in any other frequency band, is constructed of an end-open stub 20 which has a length equal to the quarter wavelength of a fundamental wave for any desired frequency included in the first-mentioned frequency band. The "wavelength" termed here signifies the effective wavelength of an electromagnetic wave which propagates through the end-open stub.

Even when the end-open stub 20 having the length equal to the quarter wavelength of the fundamental wave is employed as the one-terminal pair circuit 17 in this manner, the reflection loss can be suppressed as in the first embodiment stated before. Moreover, the above effect can be realized without affecting circuit characteristics outside the frequency band to have the reflection loss suppressed therein, by sufficiently heightening the frequency selectivity of the one-terminal pair circuit 17.

Figure 4:
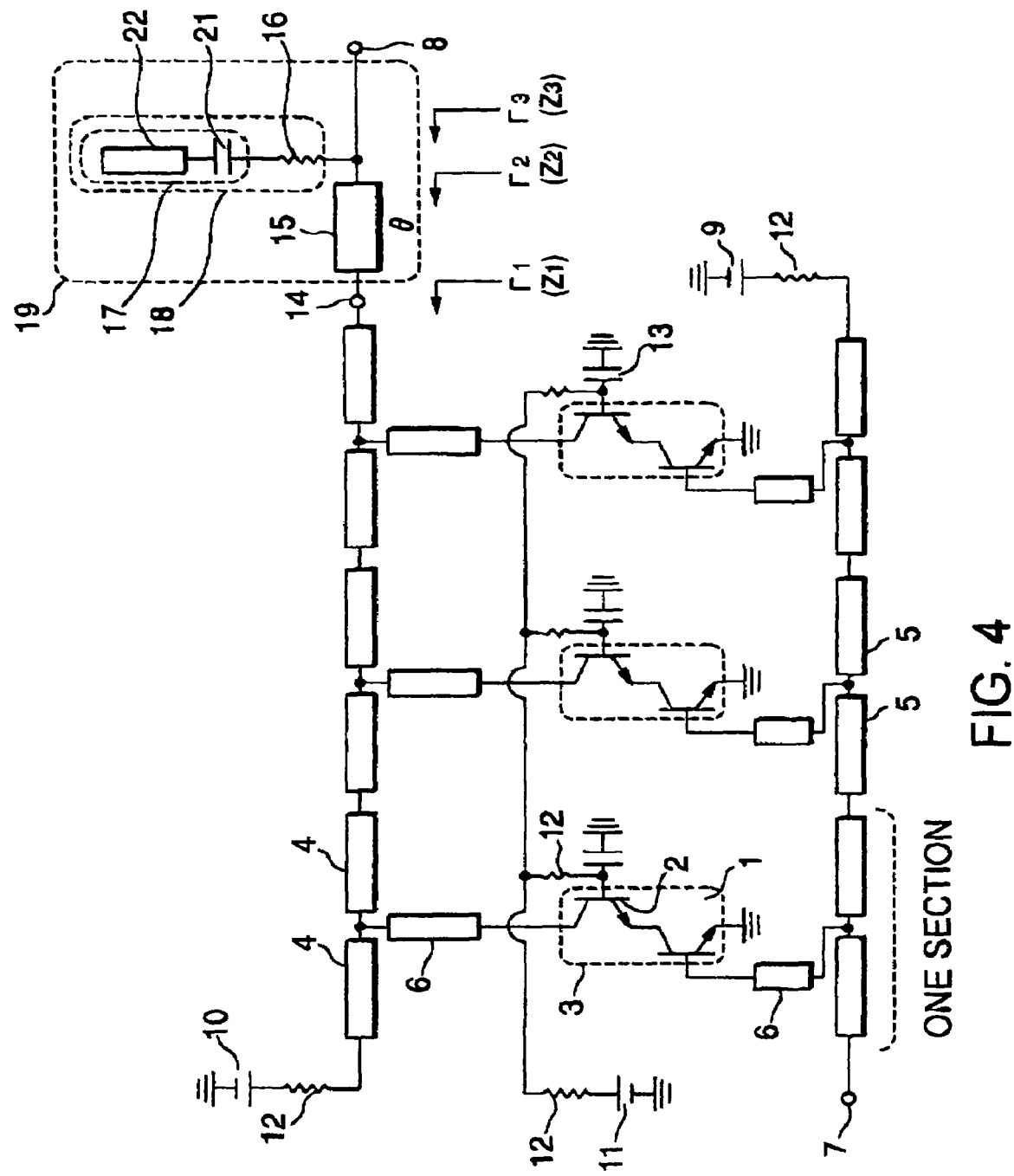
FIG. 4 is a circuit diagram for explaining the arrangement of a reflection loss suppression circuit according to the third embodiment of the present invention.
Figure 5:
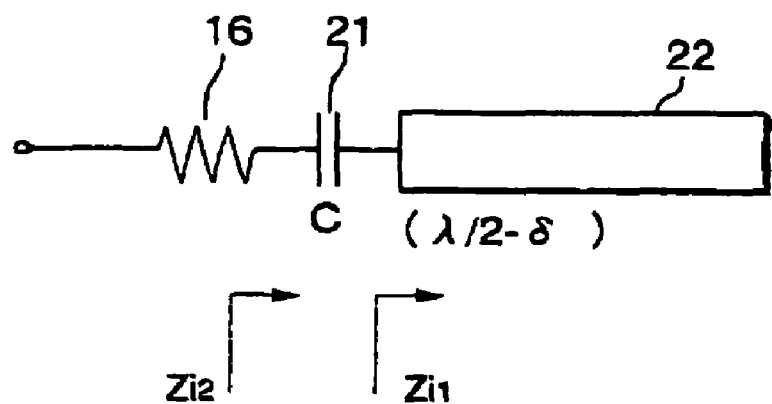
FIG. 5 is a circuit diagram showing the layout of the resistance grounding circuit of the reflection loss suppression circuit according to the third embodiment of the present invention.
Figure 6:
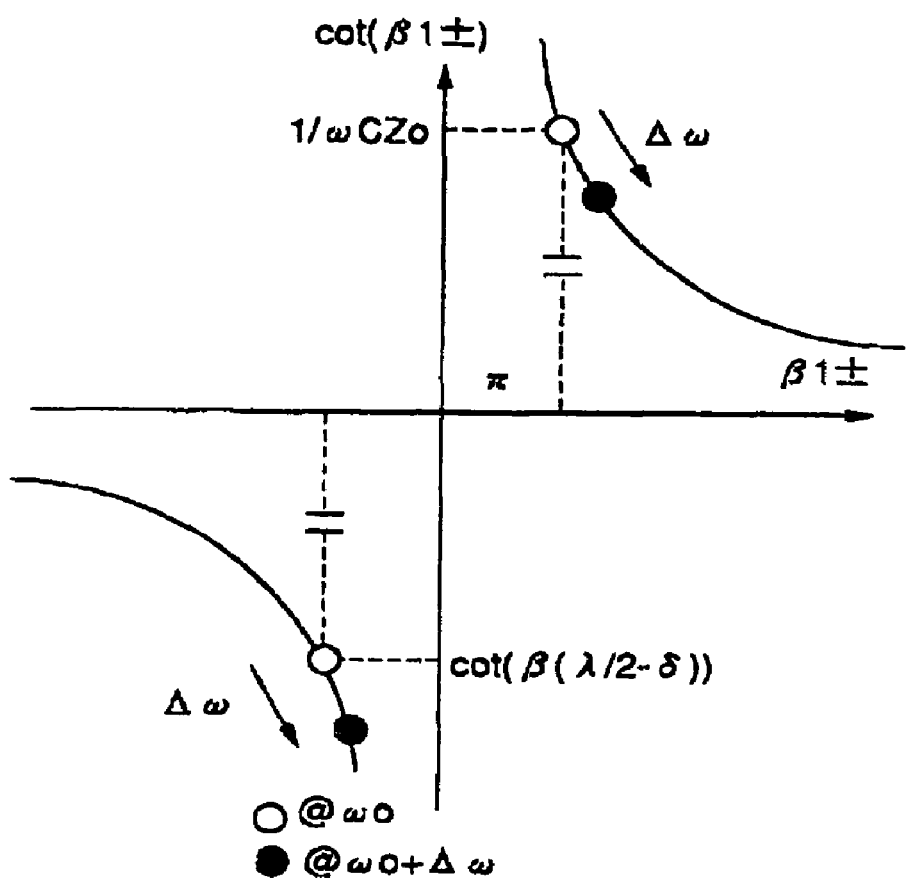
FIG. 6 is a model diagram for explaining the effect of the present invention.
Figure 7:
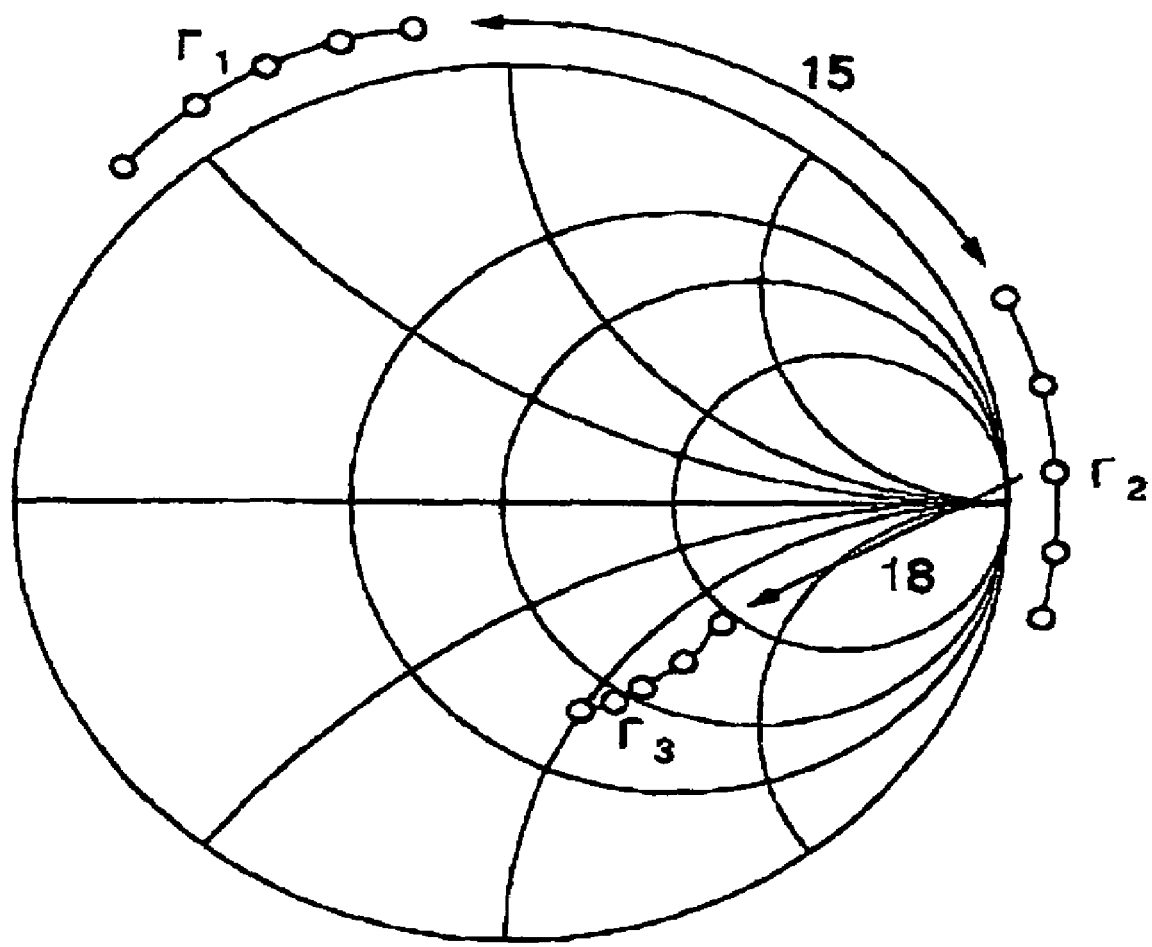
FIG. 7 is a diagram in which reflection coefficients Γ within a frequency band to have a reflection loss suppressed therein are plotted on a Smith chart.

Next, a reflection loss suppression circuit according to the third embodiment of the present invention will be described with reference to FIG. 4–FIG. 11. FIG. 4 is a circuit diagram showing an example in which the reflection loss suppression circuit in this embodiment is connected to the output end of a distributed amplifier. FIG. 5 is a circuit diagram of a resistance grounding circuit portion in the reflection loss suppression circuit. FIGS. 6 and 7 are diagrams for explaining the effects of the present invention. FIGS. 8, 9, 10 and 11 are graphs showing simulation results concerning a case where the reflection loss suppression circuit in this embodiment is mounted, and a case where it is not mounted. Incidentally, the same reference numerals and signs are assigned to the same parts as in the reflection loss suppression circuit shown in FIG. 2.

The reflection loss suppression circuit in this embodiment exhibits a low impedance in a frequency band to have a reflection loss suppressed therein. A one-terminal pair circuit 17 which exhibits a high impedance in any other frequency band, is constructed of a capacitor 21 and a ($\lambda/2-\delta$)-long end-open stub 22. Here, the ($\lambda/2-\delta$)-long end-open stub 22 is an end-open stub which has a length shorter by $\delta$ than the half wavelength of a fundamental wave for any desired frequency included in the first-mentioned frequency band. $\delta$ denotes a length which is sufficiently short as compared with the wavelength $\lambda$ of the fundamental wave. The capacitance C of the capacitor 21, the length $\delta$, and the characteristic impedance $Z_0$ and propagation constant $\gamma$ of the ($\lambda/2-\delta$)-long end-open stub 22 are selected so as to satisfy Equation (1) below at an angular frequency $\omega_0$ corresponding to the frequency. Here, Im[•] signifies to take the imaginary part of a complex number.

$$\mathrm{Im}\left[\tanh\left\{\gamma\left(\frac{\lambda}{2}-\delta\right)\right\}\right] = -\omega_o C Z_0 \quad (1)$$

Next, the effects which the reflection loss suppression circuit in this embodiment has (industrial applicability) will be described with reference to FIGS. 5–11.

FIG. 5 is the diagram showing the layout of a resistance grounding circuit 18 in the reflection loss suppression circuit 19 shown in FIG. 4. An impedance $Z_{i2}$ with the ($\lambda/2-\delta$)-long end-open stub 22 and the capacitor 21 viewed is calculated by the following equation (2):

$$Z_{12} = \frac{1}{j\omega C} + \frac{Z_0}{\tanh(\gamma 1_-)} \quad (2)$$

Here, $1_- = \lambda/2-\delta$ holds. Assuming for the sake of description that the ($\lambda/2-\delta$)-long end-open stub 22 is of low loss, Equation (2) becomes the following equation (3):

$$Z_{12} = Z_0 \frac{\alpha 1_-}{\sin^2 \beta 1_-} - jZ_0\left\{\frac{1}{\omega C Z_0} + \cot \beta 1_-\right\} \quad (3)$$

Here, $\alpha$ denotes the attenuation constant of the end-open stub 22, $\beta$ denotes the phase constant thereof, and $\gamma=\alpha+j\beta$ holds. Now that $1_-=\lambda/2-\delta$ holds, $\beta 1_-=\beta(\lambda/2-\delta)$ takes a value $(\pi-\beta\delta)$ which is slightly smaller than $\pi$, at an angular frequency $\omega_0$. On this occasion, when the capacitance C is selected so as to satisfy Equation (4) below, two terms constituting the imaginary part of Equation (3) balance and cancel each other at the angle frequency $\omega_0$.

$$-\cot \beta 1_- = \frac{1}{\omega_0 C Z_0} \quad (4)$$

In general, the loss of a transmission line is small, and the real part of Equation (3) mentioned above is very small, so that $Z_{i2}$ becomes substantially zero. This situation is shown in model-like fashion in FIG. 6.

On the other hand, when the angular frequency shifts from $\omega_0$, for example, rises by $\Delta\omega$, the values of the two terms constituting the imaginary part of Equation (3) change in the directions of arrows in FIG. 6. Since the two values having balanced with positive and negative signs decrease simultaneously, the absolute value of the imaginary part of Equation (3) increases. Here, the increasing rate of the above absolute value of the imaginary part in Equation (3), versus the frequency, can be made a sufficiently large value by setting $\delta$ to be sufficiently small as compared with the wavelength $\lambda$ of a fundamental wave. Accordingly, the frequency selectivity of the resistance grounding circuit 18 can be made satisfactorily high.

In the above description, it has been assumed for the sake of brevity that the ($\lambda/2-\delta$)-long end-open stub 22 is of low loss. In a case where the loss is to be scrupulously considered in an actual design, the individual parameters may be determined so as to satisfy Equation (1) instead of Equation (4).

FIG. 7 is such that, in the circuit (circuit in FIG. 4) in which the reflection loss suppression circuit in this embodiment is connected to the output end of the distributed amplifier, reflection coefficients Гi (i=1, 2, 3) in the frequency band to have the reflection loss suppressed therein are plotted on a Smith chart. This example handles a case where the absolute values of the reflection coefficients exceed one in the frequency band, that is, a case where a negative resistance has occurred. The ensuing description and the effects of the present invention hold quite true of a case where the absolute values of the reflection coefficients do not exceed one, that is, a case where the negative resistance has not occurred.

As shown in FIG. 7, the reflection coefficient Г1 as to which the reflection loss has increased and led to the occurrence of the negative resistance in the frequency band is moved near to a point at infinity on the Smith chart by the transmission line 15. That is, an input impedance Z1 is transformed into a high impedance Z2. Subsequently, the resistance grounding circuit 18 having the intense frequency selectivity is connected in parallel as stated before, whereby the reflection coefficient Г2 is transformed into Г3 near the center of the Smith chart. That is, the high impedance Z2 is transformed into an impedance Z3 which is close to a load impedance. Accordingly, the reflection loss in the frequency band is suppressed.

Figure 8:
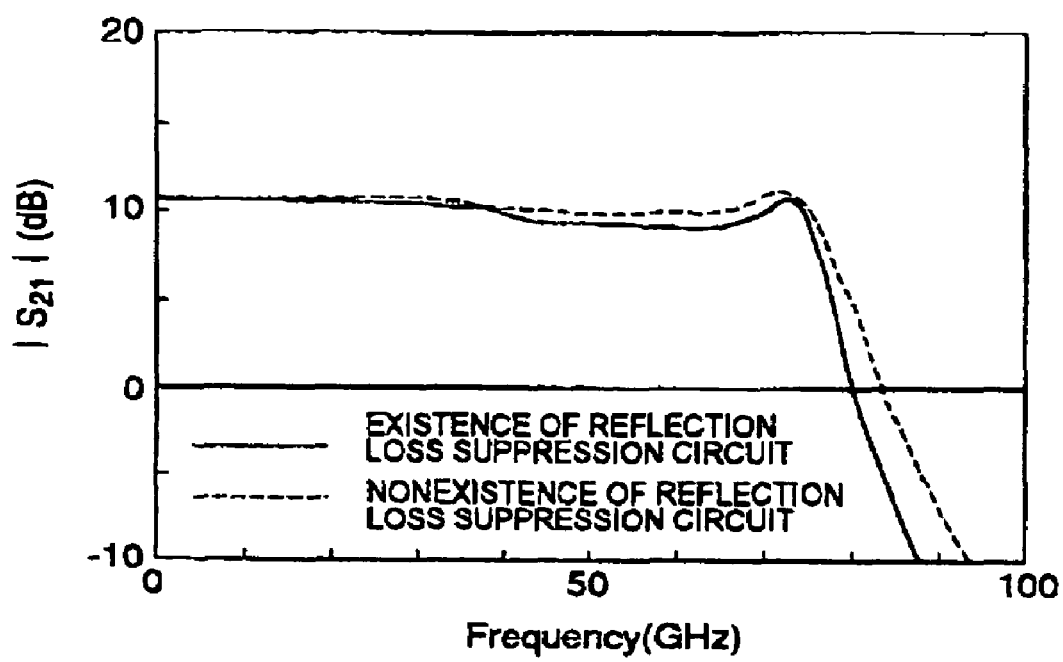
FIG. 8 is a diagram for explaining the effect of the present invention, and is a graph showing the simulation result of the frequency dependency of a gain.
Figure 9:
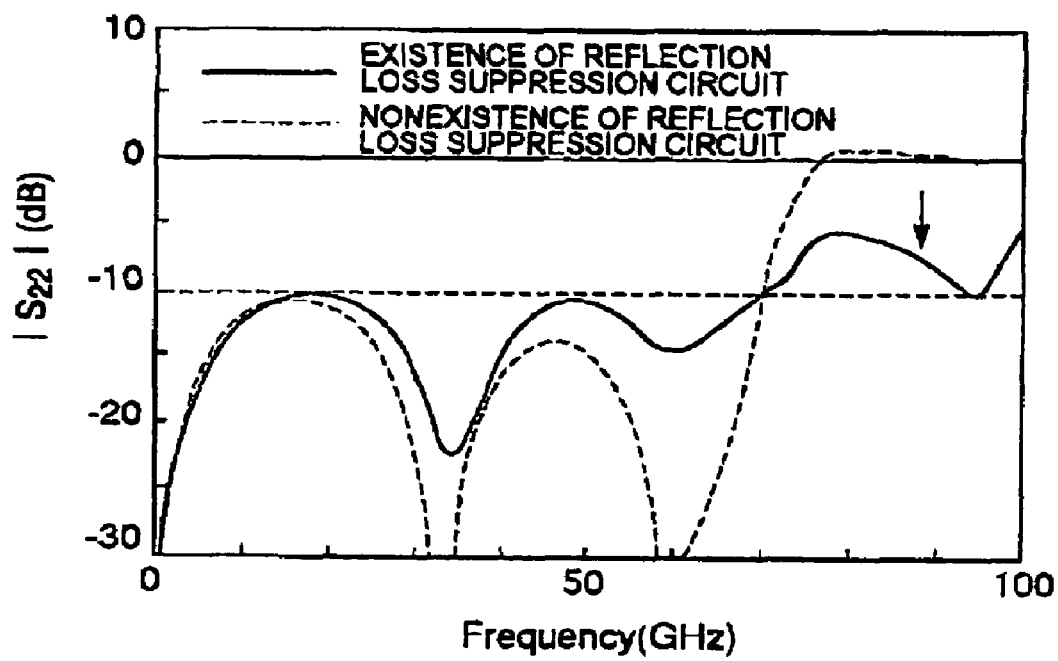
FIG. 9 is a diagram for explaining the effect of the present invention, and is a graph showing the simulation result of the frequency dependency of an output side reflection loss.

FIGS. 8 and 9 are graphs showing the simulation results of the frequency dependencies of a gain |S21| and an output side reflection loss |S22|, respectively, as to the case (the present invention) where the reflection loss suppression circuit in this embodiment is mounted, and the case (the prior art shown in FIG. 1) where it is not mounted. It is seen from both the figures that the reduction of the output side reflection loss |S22| outside the required band is achieved without appreciably affecting the gain |S21| characteristic within the required band, by mounting the reflection loss suppression circuit in this embodiment.

Figure 10:
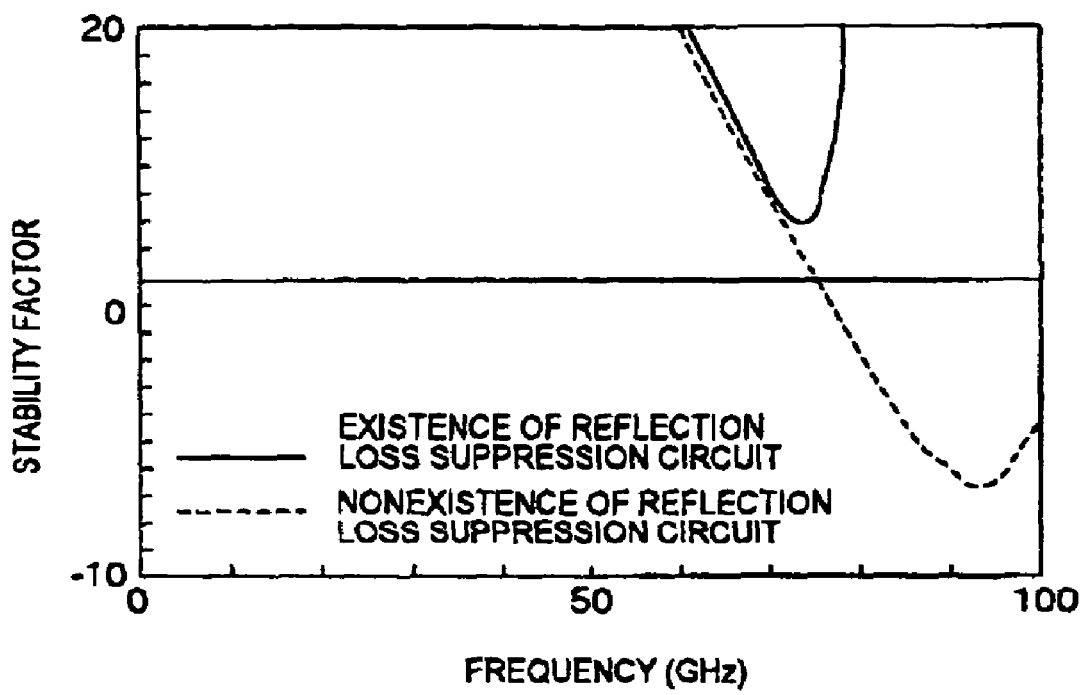
FIG. 10 is a diagram for explaining the effect of the present invention, and is a graph showing the simulation result of the frequency dependency of a stability factor.
Figure 11:
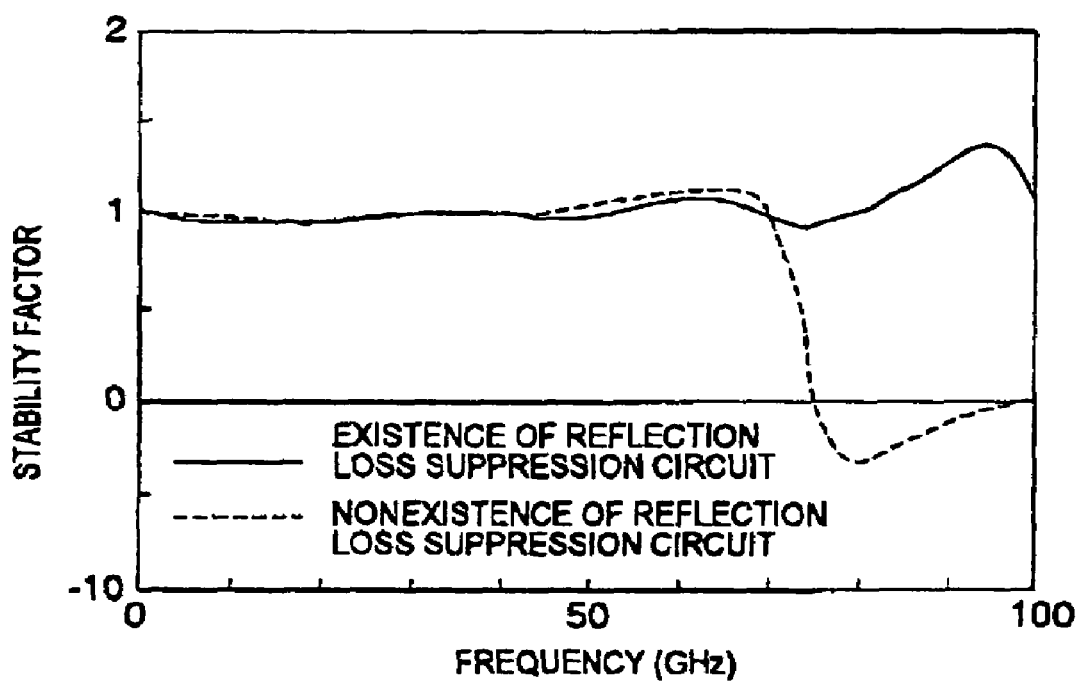
FIG. 11 is a diagram for explaining the effect of the present invention, and is a graph showing the simulation result of the frequency dependency of a stability measure.

FIGS. 10 and 11 are graphs showing the simulation results of the frequency dependencies of a stability factor and a stability measure, respectively, as to the case (the present invention) where the reflection loss suppression circuit in this embodiment is mounted, and the case (the prior art shown in FIG. 1) where it is not mounted. When the stability factor is larger than one, and when the stability measure is larger than zero, the circuit has an absolute stability. As seen from both the figures, the absolute stability is not attained in the case (the prior art) where the reflection loss suppression circuit is not mounted, whereas the absolute stability is attained by mounting the reflection loss suppression circuit in this embodiment.

Figure 12:
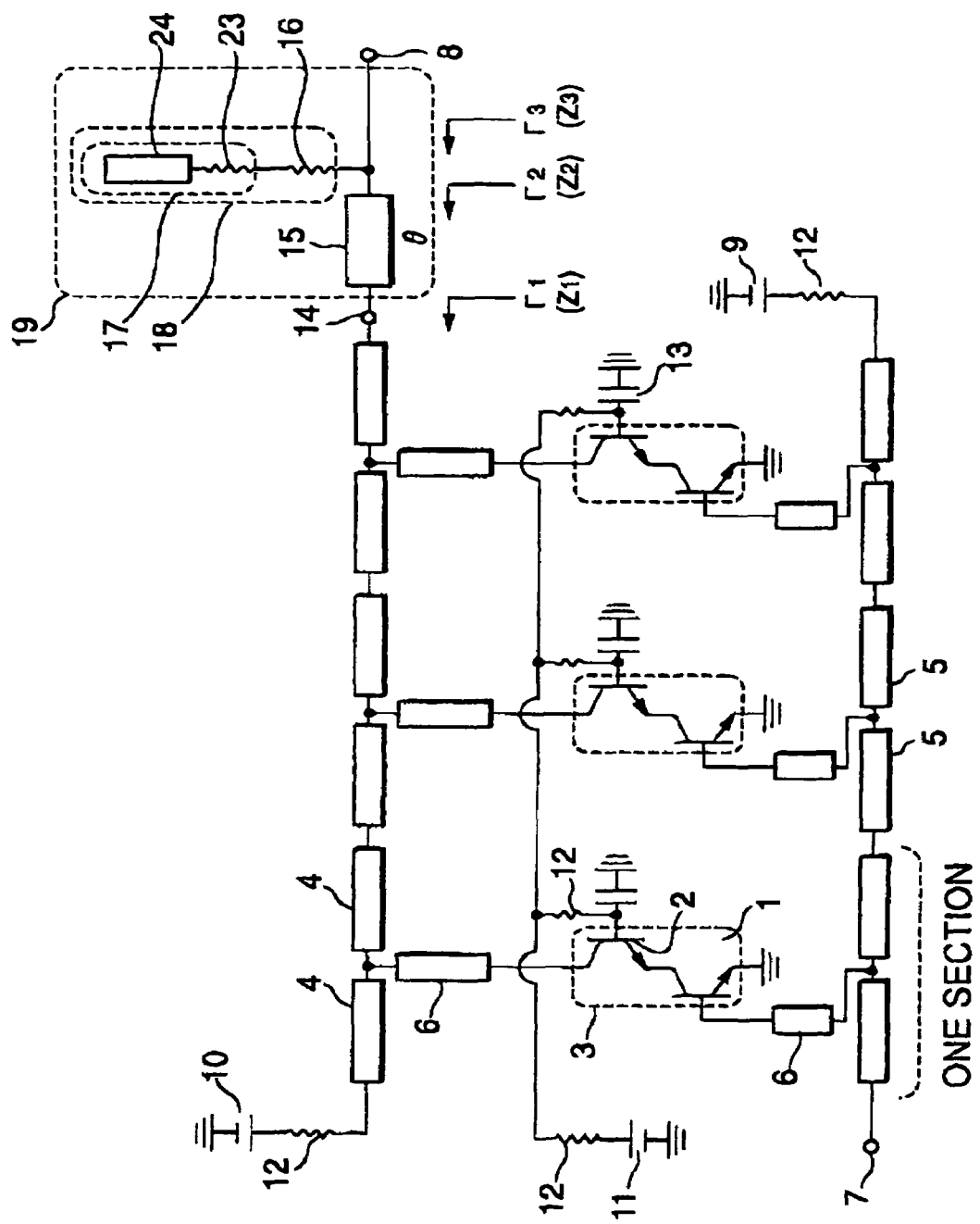
FIG. 12 is a circuit diagram for explaining the arrangement of a reflection loss suppression circuit according to the fourth embodiment of the present invention.
Figure 13:
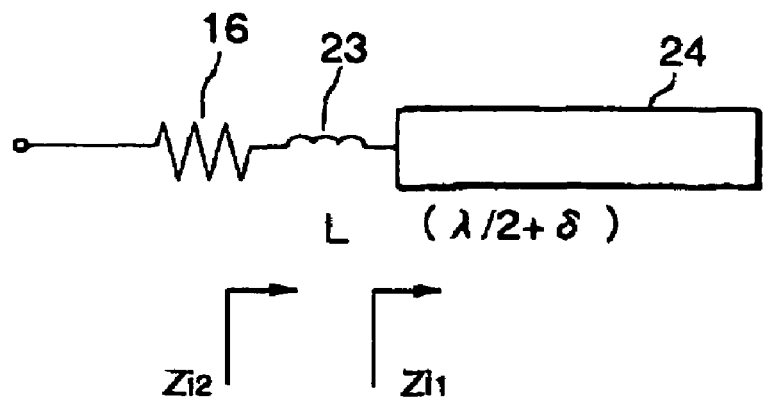
FIG. 13 is a circuit diagram showing the layout of the resistance grounding circuit of the reflection loss suppression circuit according to the fourth embodiment of the present invention.
Figure 14:
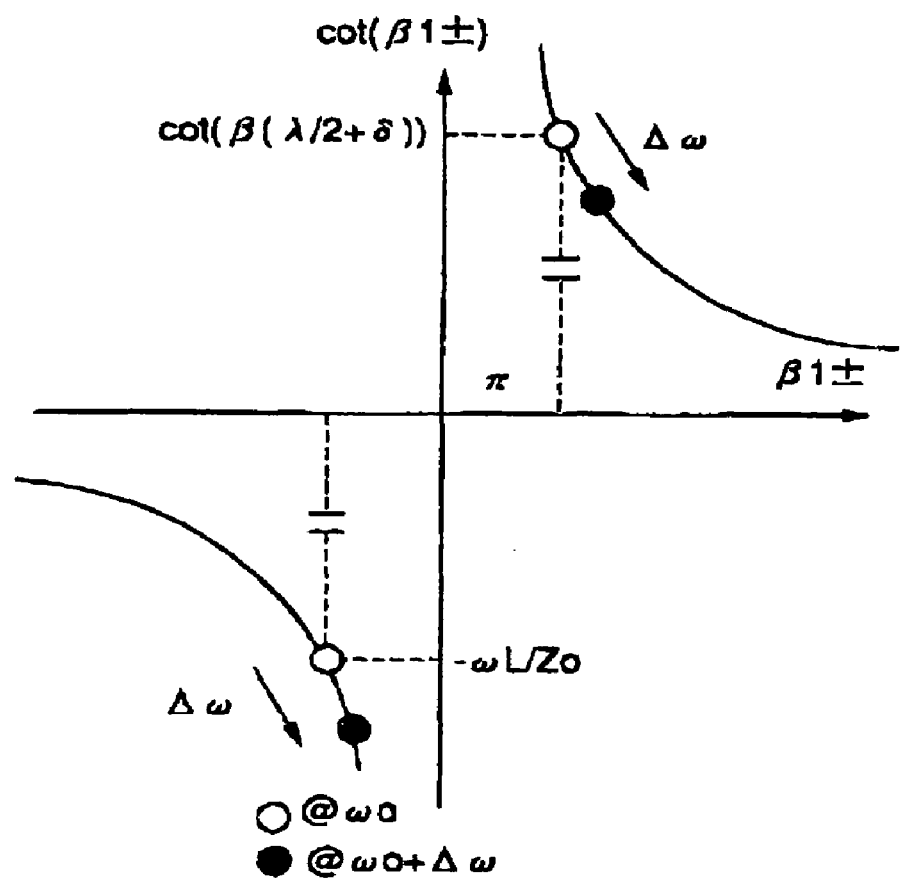
FIG. 14 is a model diagram for explaining the effect of the present invention.

Next, a reflection loss suppression circuit according to the fourth embodiment of the present invention will be described with reference to FIG. 12–FIG. 14. FIG. 12 is a circuit diagram showing an example in which the reflection loss suppression circuit in this embodiment is connected to the output end of a distributed amplifier. Besides, FIG. 13 is a circuit diagram of a resistance grounding circuit portion in the reflection loss suppression circuit. FIG. 14 is a graph showing the simulation results concerning a case where the reflection loss suppression circuit in this embodiment is mounted, and a case where it is not mounted. Incidentally, the same reference numerals and signs are assigned to the same parts as in the reflection loss suppression circuit shown in FIG. 2.

The reflection loss suppression circuit in this embodiment exhibits a low impedance in a frequency band to have a reflection loss suppressed therein. A one-terminal pair circuit 17 which exhibits a high impedance in any other frequency band, is constructed of an inductor 23 and a $(\lambda/2+\delta)$-long end-open stub 24.

Here, the $(\lambda/2+\delta)$-long end-open stub 24 is an end-open stub which has a length longer by $\delta$ than the half wavelength of a fundamental wave for any desired frequency included in the first-mentioned frequency band. $\delta$ denotes a length which is sufficiently short as compared with the wavelength $\lambda$ of the fundamental wave. The inductance L of the inductor 23, the length $\delta$, and the characteristic impedance $Z_0$ and propagation constant $\gamma$ of the $(\lambda/2+\delta)$-long end-open stub 24 are selected so as to satisfy Equation (5) below at an angular frequency $\omega_0$ corresponding to the frequency. Here, Im[•] signifies to take the imaginary part of a complex number.

$$\text{Im}\left[\tanh\left\{\gamma\left(\frac{\lambda}{2}+\delta\right)\right\}\right] = \frac{Z_0}{\omega_0 1_-} \quad (5)$$

Next, the effects which the reflection loss suppression circuit in this embodiment has (industrial applicability) will be described with reference to FIGS. 13 and 14.

FIG. 13 is the diagram showing the layout of a resistance grounding circuit 18 in the reflection loss suppression circuit 19 shown in FIG. 12. An impedance $Z_{i2}$ with the $(\lambda/2+\delta)$-long end-open stub 24 and the inductor 23 viewed is calculated by Equation (6) below. Here, $1_+=\lambda/2+\delta$ holds.

$$Z_{12} = j\omega L + \frac{Z_0}{\tanh(\gamma 1_+)} \quad (6)$$

Assuming for the sake of description that the $(\lambda/2+\delta)$-long end-open stub 24 is of low loss, Equation (6) becomes Equation (7) below. Here, $\alpha$ denotes the attenuation constant of the end-open stub 24, $\beta$ denotes the phase constant thereof, and $\gamma$ denotes a value satisfying $\gamma=\alpha+j\beta$.

$$Z_{12} = Z_0 \frac{\alpha 1_+}{\sin^2 \beta 1_+} + jZ_0\left\{\frac{\omega L}{Z_0} - \cot \beta L_+\right\} \quad (7)$$

Now that $1_+=\lambda/2+\delta$ holds, $\beta 1_+=\beta(\lambda/2+\delta)$ takes a value $(\pi+\beta\delta)$ which is slightly larger than $\pi$, at an angular frequency $\omega_0$. On this occasion, when the inductance L is selected so as to satisfy Equation (8) below, two terms constituting the imaginary part of the above equation (7) balance and cancel each other at the angle frequency $\omega_0$.

$$\cot \beta 1_+ = \frac{\omega_0}{Z_0} \quad (8)$$

In general, the loss of a transmission line is small, and the real part of Equation (7) is very small, so that $Z_{i2}$ becomes substantially zero. This situation is shown in model-like fashion in FIG. 14.

On the other hand, when the angular frequency rises by $\Delta\omega$ from $\omega_0$, the values of the two terms constituting the imaginary part of Equation (7) change in the directions of arrows in FIG. 14. Since the two values having balanced with positive and negative signs decrease simultaneously, the absolute value of the imaginary part of Equation (7) increases. Here, the increasing rate of the above absolute value of the imaginary part in Equation (7), versus the frequency, can be made a sufficiently large value by setting $\delta$ to be sufficiently small as compared with the wavelength $\lambda$ of a fundamental wave. Accordingly, the frequency selectivity of the resistance grounding circuit 18 can be made satisfactorily high.

In the above description, it has been assumed for the sake of brevity that the $(\lambda/2+\delta)$-long end-open stub 24 is of low loss. In a case where the loss is to be scrupulously considered in an actual design, the individual parameters may be determined so as to satisfy Equation (5) instead of Equation (8).

Figure 15:
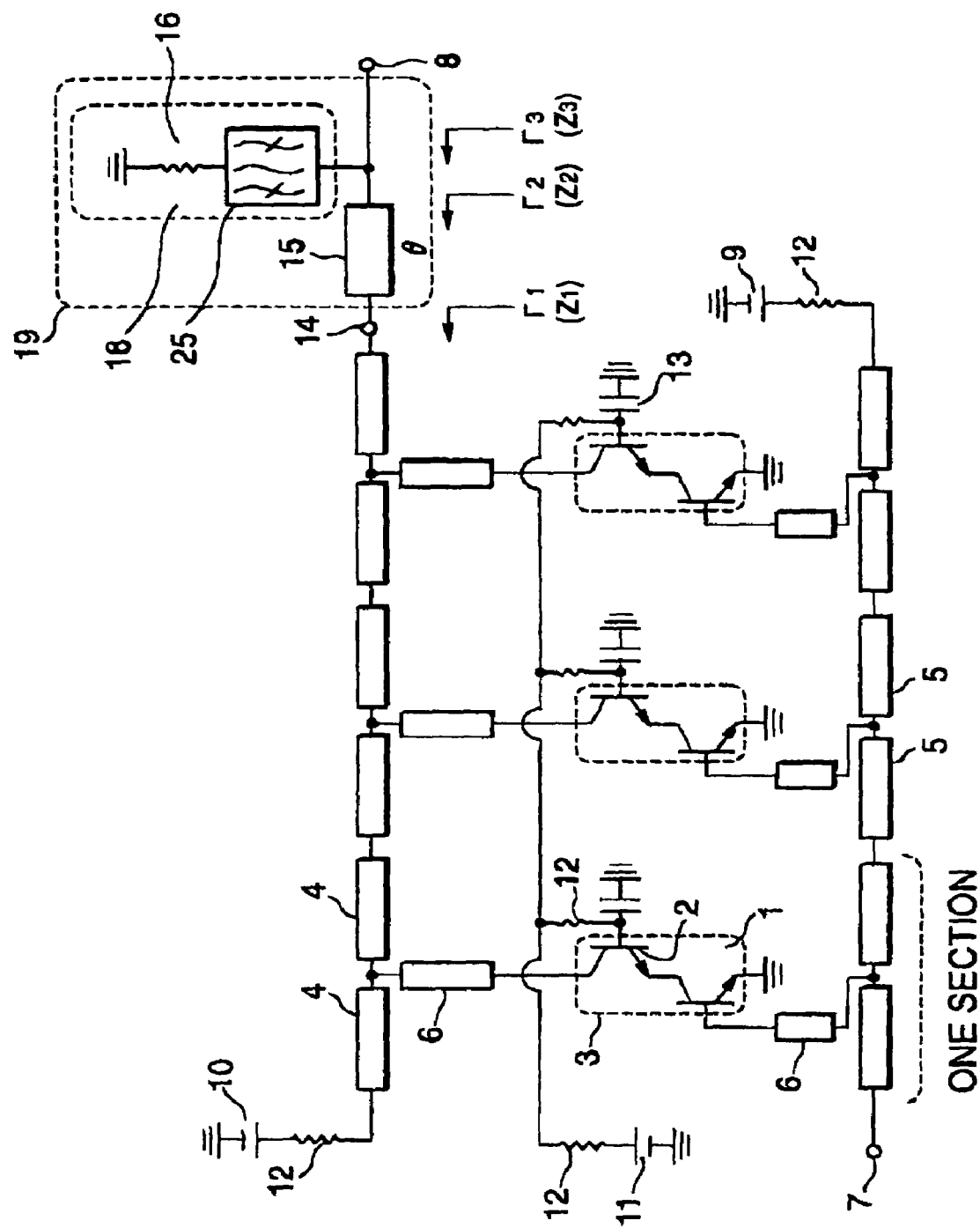
FIG. 15 is a circuit diagram for explaining the arrangement of a reflection loss suppression circuit according to the fifth embodiment of the present invention.

Next, a reflection loss suppression circuit according to the fifth embodiment of the present invention will be described with reference to FIG. 15. FIG. 15 is a circuit diagram showing an example in which the reflection loss suppression circuit in this embodiment is connected to the output end of a distributed amplifier. Incidentally, the same reference numerals and signs are assigned to the same parts as in the reflection loss suppression circuit shown in FIG. 2.

The reflection loss suppression circuit in this embodiment features the point that a resistance grounding circuit 18 having a frequency selectivity is constructed of a circuit in which a band-pass filter 25 for passing the signal of a frequency band to have a reflection loss suppressed therein is grounded through a resistor 16. The reflection loss can be suppressed even by such a construction. The effects stated before can be realized without affecting circuit characteristics outside the frequency band to have the reflection loss suppressed therein, by sufficiently heightening the frequency selectivity of the band-pass filter 25.

Figure 16:
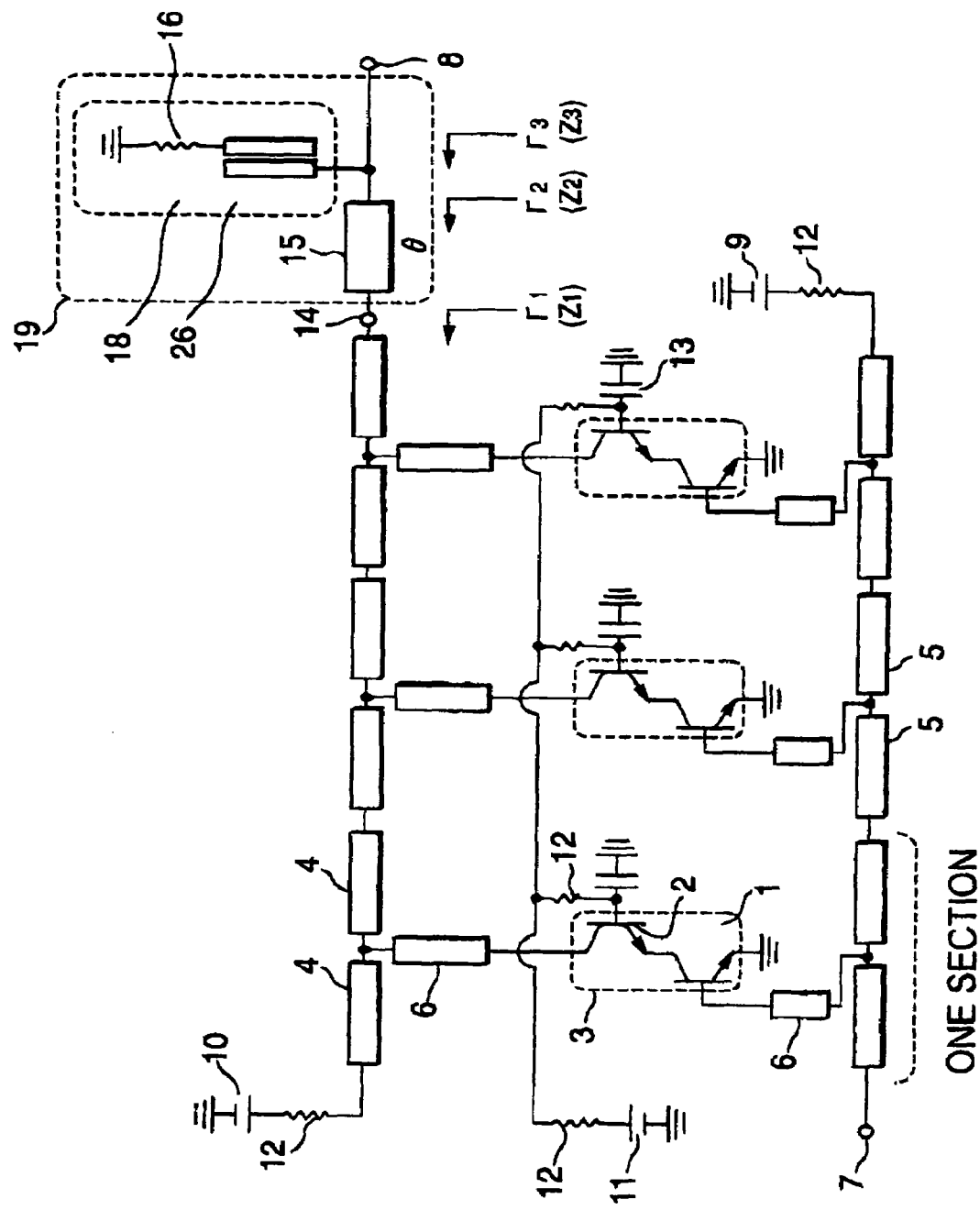
FIG. 16 is a circuit diagram for explaining the arrangement of a reflection loss suppression circuit according to the sixth embodiment of the present invention.

Next, a reflection loss suppression circuit according to the sixth embodiment in the present invention will be described with reference to FIG. 16. FIG. 16 is a circuit diagram showing an example in which the reflection loss suppression circuit in this embodiment is connected to the output end of a distributed amplifier. Incidentally, the same reference numerals and signs are assigned to the same parts as in the reflection loss suppression circuit shown in FIG. 15.

The reflection loss suppression circuit in this embodiment features the point that the band-pass filter 25 in the fifth embodiment is constructed of an interdigital capacitor 26. The reflection loss can be suppressed even by such a construction. The effects stated before can be realized without affecting circuit characteristics outside a frequency band to have the reflection loss suppressed therein, by sufficiently heightening the frequency selectivity of the interdigital capacitor 26.

Incidentally, the above embodiments have been described by exemplifying the distributed amplifier as the circuit from which the reflection loss is to be suppressed. However, the present invention is not restricted to the embodiments, but it is applicable in various circuits such as amplifiers, oscillators, mixers, frequency multipliers and frequency dividers of all types, and further, multifarious digital circuits as may be needed.

Besides, in the above embodiments, the HBTs (Heterojunction Bipolar Transistors) are employed as basic elements. The present invention, however, can also be applied to circuits which employ any sorts of devices including FETs such as MESFETs (Metal Semiconductor Field Effect Transistors) or HEMTs (High Electron Mobility Transistors), and silicon bipolar transistors.

INDUSTRIAL APPLICABILITY

As described above, according to the present invention, an output or input impedance in a frequency band to have a reflection loss suppressed therein is transformed into a high impedance by a transmission line having a suitable electric length, and a resistance grounding circuit having a high frequency selectivity is thereafter connected in parallel, whereby the reflection loss in the desired frequency band outside a required band can be reduced without affecting circuit characteristics in the required frequency band. Further, the stability of a circuit can be enhanced owing to the reduction of the reflection loss.

The invention claimed is:

1. In a radio frequency circuit or a digital circuit, a reflection loss suppression circuit comprising:
    a transmission line which transforms an output impedance or an input impedance in a specified frequency band into a high impedance; and
    a resistance grounding circuit having a frequency selectivity, which is connected in parallel with said transmission line as viewed from an output terminal side or an input terminal side;
    said resistance grounding circuit including a resistor having a predetermined resistance in the vicinity of a load resistance or a signal source resistance, and having a low impedance in the specified frequency band;
    said resistance grounding circuit including a circuit which is determined by a one-terminal pair circuit having a high impedance outside said frequency band, wherein;
    said one-terminal pair circuit includes a circuit in which an inductor element is terminated by an end-open stub longer by $\delta$ than a half wavelength of a fundamental wave, when $\delta$ is let denote a length being sufficiently small as compared with a wavelength $\lambda$ of the fundamental wave at any desired frequency included in said frequency band; and
    at an angular frequency $\omega_0$ corresponding to the frequency, an inductance $L$ of said inductor element, a characteristic impedance $Z_0$ and a propagation constant $\gamma$ of said end-open stub, and the length $\delta$ are selected so as to satisfy:

$$Im[\tanh\{\gamma(\lambda/2+\delta)\}]=Z_0/(\omega_0 \times L).$$

2. A reflection loss suppression circuit as defined in claim 1, characterized in that said transmission line and said end-open stub are formed by employing microstrip lines.

3. A reflection loss suppression circuit as defined in claim 1, characterized in that said transmission line and said end-open stub are formed by employing coplanar lines.

4. A reflection loss suppression circuit as defined claim 1, wherein:
    an electric length of said transmission line is set in a range of ±50% of an absolute value of an output impedance with said transmission line viewed; and
    a resistance of said resistor comprising said resistance grounding circuit is set in a range of 0.5 through 2 times the load resistance or the signal source resistance.

5. A wideband amplifier characterized in that the reflection loss suppression circuit as defined in claim 1 is comprised at, at least, one of an output end and an input end.

* * * * *